United States Patent [19]

Kakehi et al.

[11] Patent Number: 4,718,681

[45] Date of Patent: Jan. 12, 1988

[54] SAMPLE CHUCKING APPARATUS

[75] Inventors: Yutaka Kakehi, Hikari; Ryokichi Kaji, Chiyoda; Hideki Izumi, Kudamatsu; Toshiaki Makino, Kudamatsu; Kazuaki Ichihashi, Kudamatsu; Sosuke Kawashima, Kudamatsu, all of Japan

[73] Assignee: Hitachi, Ltd., Tokyo, Japan

[21] Appl. No.: 768,332

[22] Filed: Aug. 22, 1985

[30] Foreign Application Priority Data

Aug. 31, 1984 [JP] Japan .................................. 59-180509
Dec. 3, 1984 [JP] Japan .................................. 59-254009

[51] Int. Cl.⁴ ............................................. B23B 31/18
[52] U.S. Cl. ..................................... 279/106; 269/237; 269/254 R
[58] Field of Search ................ 269/8, 254 R, 254 CS, 269/104, 188, 216, 224, 237–239; 279/1 M, 23 R, 46 R, 35–37, 106, 109; 335/217, 300

[56] References Cited

U.S. PATENT DOCUMENTS

| | | | |
|---|---|---|---|
| 2,528,734 | 11/1950 | Brass | 335/300 X |
| 2,796,313 | 6/1957 | Schumacher | 279/106 X |
| 3,225,269 | 12/1965 | Worcester | 335/300 X |
| 3,672,556 | 6/1972 | Diepeveen | 269/224 X |
| 4,306,731 | 12/1981 | Shaw | 269/254 R X |
| 4,475,681 | 10/1984 | Ingle | 228/4.5 |
| 4,495,398 | 1/1985 | Bredow et al. | 269/237 X |
| 4,509,298 | 4/1985 | Klievoneit | 279/106 X |

Primary Examiner—Gil Weidenfeld
Assistant Examiner—Steven C. Bishop
Attorney, Agent, or Firm—Antonelli, Terry & Wands

[57] ABSTRACT

A sample chucking apparatus including a clip provided at a plurality of positions correspondingly to a sample and operating closedly to release and hold the sample, with the clip being acutated by a magnetic force. A spring force counters the direction in which the clip operates, thereby simplifying the structure and ensuring a reliability on fixing or carrying of the sample.

10 Claims, 11 Drawing Figures

SAMPLE CHUCKING APPARATUS

BACKGROUND OF THE INVENTION

This invention relates to a sample chucking apparatus and, more particularly, to a sample chucking apparatus suitable for semiconductor manufacturing equipment for which a sample needs to be fixed or carried.

As a super structure is utilized on VLSI, for increasing productivity, it is essential in semiconductor manufacturing equipment that dust not be allowed to stick on the surface of a semiconductor element substrate (hereinafter called "wafer") or sample. Accordingly, a posture of the wafer to be fixed or carried for processing is changed from a position in which the surface to be processed is maintained horizontally upward to a position in which the surface to be processed is maintained vertically or horizontally downward, and the tendency is particularly remarkable with the semiconductor manufacturing equipment for forming a film on the wafer surface to be processed by a sputtering device of the manufacturing equipment.

In, for example, Japanese Laid Open Application No. 103442/1981, a sample chucking apparatus used on a conventional semiconductor manufacturing device is proposed wherein a wafer or a sample is held by a spring force of a plurality of clips, and the wafer is released by mechanically expanding the clips on a pusher.

In the sample chucking apparatus, the wafer is held and released in the atmosphere and an air cylinder or the like is used for actuating the pusher, with the pusher being movable along a flexible piping provided therefor.

However, in sputtering devices of semiconductor manufacturing equipment, it is necessary for the sample to be moved from a horizontal position to a vertical position or from a vertical position to a horizontal position under vacuum so as to process the sample at a preferable degree of vacuum, and thus, in the semiconductor manufacturing equipment using a conventional sampling chucking apparatus, the structure inevitably becomes complicated and it is difficult to secure a reliable fixing or carrying of the sample. Furthermore, a volume of a vacuum chamber in which the sample chucking apparatus is provided becomes larger resulting in an increase of the exhaust time.

An object of this invention is to provide a sample chucking apparatus which is simple in construction and which ensures a reliable fixing or carrying of a sample.

According to the invention, the sample chucking apparatus comprises a clip provided at a plural portion correspondingly to a sample and operating closably to release and hold the sample, a means for actuating the clip using a magnetic force, a means for actuating the clip using a spring force counter to the direction in which the clip operates, and a magnetic force, and the apparatus is simple in structure and ensures a reliable fixing or carrying or the sample,

DESCRIPTION OF THE PREFERRED EMBODIMENTS

Figure 1:
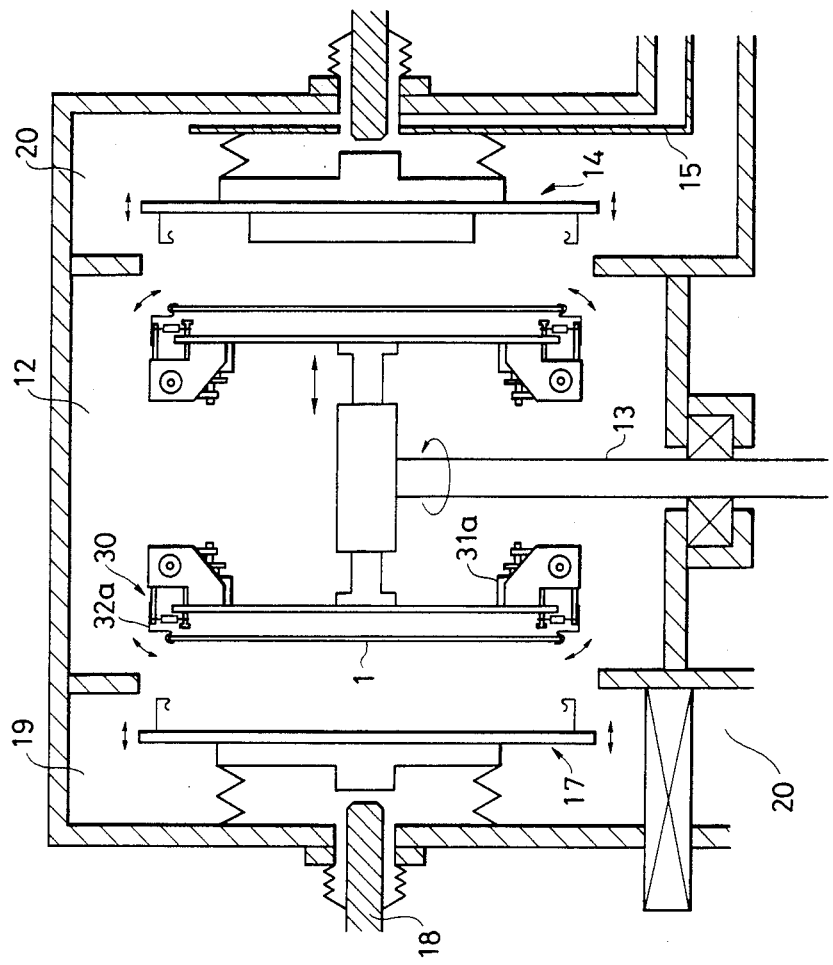
FIG. 1 is a longitudinal cross-sectional view of a sputtering device to which a sample chucking apparatus according to the present invention is applied.

Referring now to the drawings wherein like reference numerals are used throughout the various views to designate like parts, and more particularly, to FIG. 1, according to this Figure, a simple chucking apparatus, applied to a sputtering device of semiconductor manufacturing equipment, is adapted to carry a wafer 1 or a sample into a load lock chamber 19 from the atmosphere 20 to be held on a wafer retainer 17. The wafer retainer 17 is then displaced toward an auxiliary vacuum chamber 12 by a pusher 18, a sample chucking apparatus 30 is provided within the auxiliary vacuum chamber 12 is also displaced toward the load lock chamber 19, and the wafer retainer 17 and the sample chucking apparatus 30 are stopped at a position where the wafer is reheld. Next, a solenoid 31a of the sample chucking apparatus 30 is driven to catch the wafer 1 on a clip 32a, and a wafer release (not shown) of the wafer retainer 17 is driven to release the wafer 1 thereby reholding the wafer 1. Next, after the sample chucking apparatus 30 is moved to an original position, a shaft 13 is rotated 180° to move the wafer 1. The wafer 1 on the sample chucking apparatus 30 is then delivered to a wafer retainer 14 provided in the vacuum chamber 20. A rotary drum 15 in which the wafer retainer 14 is provided is rotated intermittently, and thus the wafer 1 is subjected to sputtering. After the sputtering is completed, the wafer 1 is then taken out of the atmosphere 20 by reversing the above procedure.

The sample chucking apparatus 30 will be described in detail with reference to FIG. 2-4.

Figure 2:
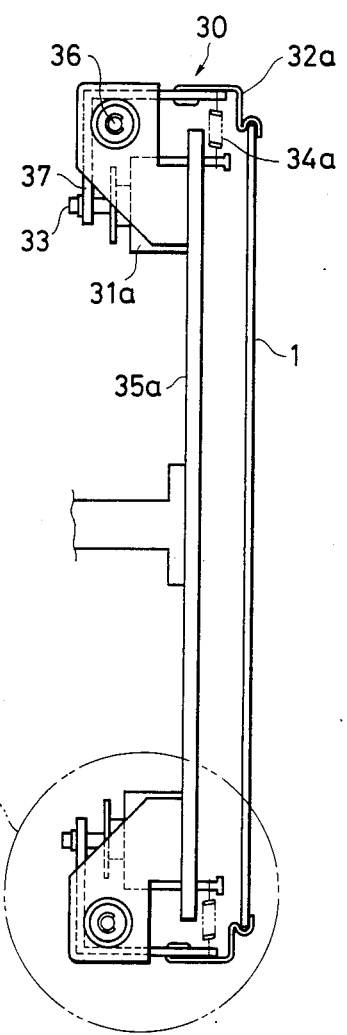
FIG. 2 is a frontal view of the sample chucking apparatus of FIG. 1.
Figure 3:
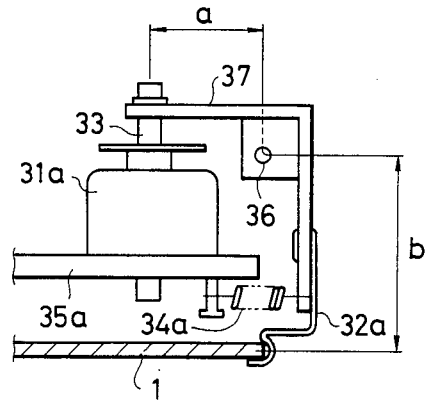
FIG. 3 is an enlarged view of the detailed A of FIG. 2.
Figure 4:
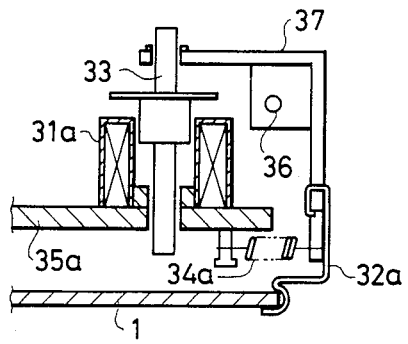
FIG. 4 is a longitudinal cross-sectional view of a FIG. 3.

As shown in FIGS. 2-4, the sample chucking apparatus 30 is provided with a solenoid 31a, with the clip 32a being provided on a plunger 33 of the solenoid 31a, and a spring such as, for example, a coil spring 34a is provided for moving the clip 32a in a direction opposite to a direction in which the clip 32a is displaced by the plunger 33.

In FIGS. 2-4, the solenoid 31a is provided on a base 35a so that the plunger 33 moves in the direction almost vertical to the surface of the wafer 1 to be processed. The shaft 36 is provided on the base 35a, and an L-shaped arm 37 is rotatably provided on the shaft 36. One rotary end side of the arm 37 is provided on the plunger 33, and the clip 32a is provided on another rotary end side of the arm 37. Then, the coil spring 34a is provided, in this case, between the base 35a in the other end of the arm 37. In the state illustrated in FIGS. 2–4, when a current is supplied to the solenoid 31a, the plunger 33 is drawn in toward the wafer 1. The other end of the arm 37 is rotated counterclockwise against a force of the coil spring 34a according to a move of the plunger 33. Consequently, the clip 32a moves in a release direction, and the wafer 1, held on the clip 32a, is released. When the wafer 1 is held on the clip 32a by interrupting the current supplied to the solenoid 31a. That is, when the current supplied to the solenoid 31a is interrupted, the other end of the arm 37 is rotated clockwise by a force of the coil spring 34a. Thus, the clip 32a moves in a holding direction, and the wafer 1 is securely held on the clip 32a by a force of the coil spring 34a.

According to the embodiment, the following effects will be obtainable.

A simple construction is provided which nevertheless is reliable with regard to a fixing or carrying of the wafer under vacuum.

Moreover, since the sample chucking apparatus can be mniniaturized, a volume of the auxiliary vacuum chamber can be minimized to reduce the time for exhausting the auxiliary vacuum chamber.

Additionally, a stroke of the clip 32a in the wafer holding/releasing direction can be larger than a stroke of the solenoid by selecting a lever ratio a/b in FIG. 3 to be less than one, thereby reducing the size of the solenoid 31a.

Furthermore, an elastic material is used for the clip 32a to hold the wafer 1 in a soft touch, therefore, the marring of the wafer 1 can be prevented.

Figure 5:
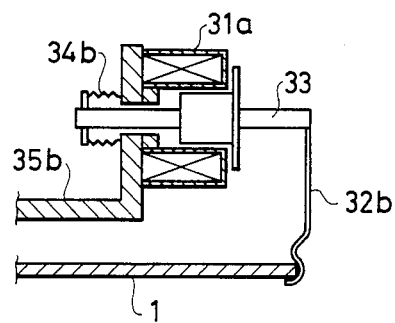
FIG. 5 is a partial longitudinal cross-sectional view of another embodiment of the sample chucking apparatus constructed in accordance with the present invention.

FIG. 5 represents the second embodiment of the sample chucking apparatus according to the invention, which varies from, for example, FIG. 4, in that the solenoid 31a is provided on a base 35b so that a moving direction of the plunger 33 will be almost parallel with the surface of the wafer 1 to be processed, with a clip 32b being provided directly on one end of the plunger 31, and a coil spring 34b being provided between the other end of the plunger 31 and the base 35b.

In the embodiment of FIG. 5, the stroke of the plunger 33 and that of the clip 32b are equal to each other, and the stroke of the clip 32b is reduced as compared with the embodiment of FIG. 4, however, since the arm and the shaft are not required, unlike the embodiment of FIG. 4, the construction can be further simplified.

Figure 6:
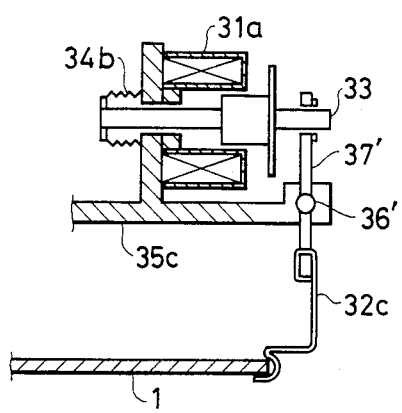
FIG. 6 is a partial longitudinal cross-sectional view of a portion of yet another embodiment of the sample chucking apparatus constructed in accordance with the present invention.

FIG. 6 represents a third embodiment of the sample chucking apparatus according to the invention, which varies from, for example, FIG. 4 in that the solenoid 31a is provided with a base 35c so that a moving direction of the plunger 33 will be almost parallel with the surface of the wafer 1 to be processed, and an I-shaped arm 37' is rotatably provided on a shaft 36' provided on a base 35c, with one end of the arm 37' being provided on one end of the plunger 33, and a clip 32c being provided on the other end of the arm 37', and with a coil spring 34b being provided between the other end of the plunger 33 and the base 35c.

Effects similar to those of the above described embodiments of FIGS. 4 and 5 will be obtainable in the embodiment of FIG. 6.

Figure 7:
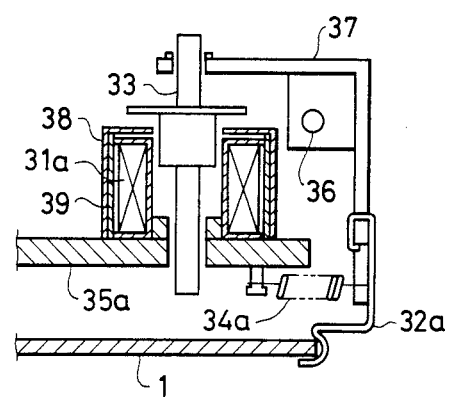
FIG. 7 is a partial longitudinal cross-sectional view of a still further embodiment of a sample chucking apparatus constructed in accordance with the present invention.

FIG. 7 represents the fourth embodiment of the sample chucking apparatus according to the invention which varies from, for example, FIG. 4, in that a radiating means 39, formed of a heat conductive material such as aluminum, copper or the like, is disposed in a space between a case 38 for enclosing the solenoid 31a along an inside wall surface of the case 38.

In the embodiment of FIG. 7, Joulean heat generated by the solenoid 31a by the supplied current can be effectively radiated by the radiating means 39, therefore, an accumulation of the Joulean heat in the solenoid 31a can be prevented. Consequently, an increase in electric resistance of the solenoid 31a, due to the accumulation of the Joulean heat, and a decrease in supply current (voltage being constant) can be prevented, and a decrease in suction power of the solenoid 31a can be prevented. Accordingly, in the embodiment of FIG. 7, the reliability of holding the wafer 1 can further be enhanced and stabilized as compared with the above described embodiments of FIGS. 4–6. Then, in the embodiment of FIG. 7, an arrangement is such that an accumulation of Joulean heat generated on the solenoid 31a by the supplied current is prevented by enhancing a radiation efficiency, however, Joulean heat generated on the solenoid 31a by the supplied current can be forcibly removed through the base by a cooling means. The cooling means may, for example, comprise circulating a coolant or cooling water, for example, interiorly or utilizing a heat pipe.

Figure 8:
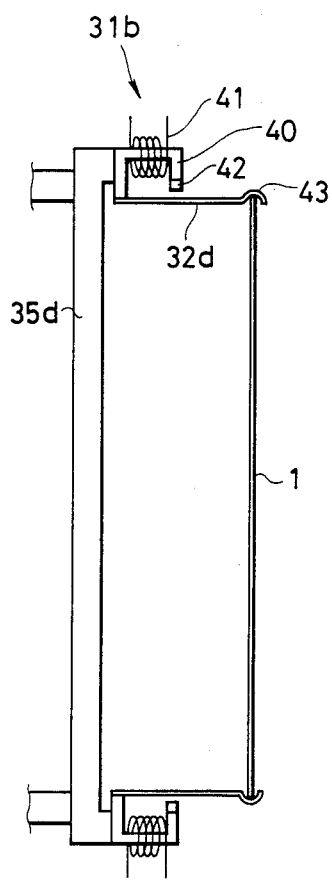
FIG. 8 is a front view of a further embodiment of a sample chucking apparatus constructed in accordance with the present invention.

FIG. 8 represents the fifth embodiment of the sampling chuck apparatus according to the present invention, wherein the sampling chucking apparatus comprises a solenoid 31b and a clip 32d adapted to be closed on excitation and with the resilience thereof releasing and holding the wafer 1. The solenoid 31b includes a substantially U-shaped yoke 40, a coil 41 wound on the yoke 40, and a stopper 42 formed of a non-magnetic material and provided on the yoke 40 correspondingly to the clip 32d. The clip 32d is provided to operate on excitation of the solenoid 31b. In this case, an upper end of the clip 32d is provided on an ;upper portion of the U-shaped end of the yoke 40, and the stopper 42 is provided on a lower portion of the U-shaped end of the yoke 40 correspondingly to the clip 32d. A sample holding part 43 is provided on a lower end portion of the clip 32d. The solenoid 31b and the clip 32d are disposed at positions where the wafer 1 can be delivered satisfactorily with a wafer retainer (not shown). In the condition illustrated in FIG. 8, when a current is supplied to the coil 41, the solenoid 31b is excited, and the clip 32d is actuated to open by the magnetic force against the spring force. Consequently, the wafer 1, held on the sample holding part 43 of the clip 32d is released. In case the wafer 1 is held on a sample holding part 43 of the clip 32d, the current supplied to the coil 41 will be interrupted to interrupt the excitation of the solenoid 31b. Then the clip 32d is actuated to close by the spring force, and the wafer 1 is held on the sample holding part 43 of the clip 32d.

In the embodiment of FIG. 8, in addition to providing a simple and reliable structure for carrying the wafer 1 and a miniaturization of the sample chucking apparatus, a displacement of the clip 32d can also be limited by providing the stopper 42 on the yoke 40, and a residual magnetic force when excitation of the solenoid 31b is interrupted can be minimized; therefore, the handling time for carrying the wafer 1 can be improved.

Figure 9:
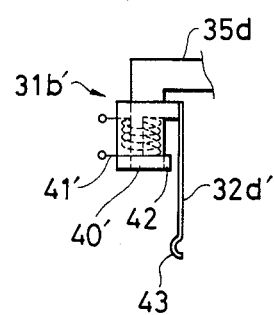
FIG. 9 is a fragmentary front view of a still further embodiment of a sample chucking apparatus according to the present invention.

FIG. 9 varies from FIG. 8 in that a yoke 40', which constitutes a solenoid 31b' a coil 41', and a clip 32d' are coated with a material, i.e., aluminum or alumina with less emission gas as compared to a magnetic material.

In the embodiment of FIG. 9, an exhaust time of the vacuum chamber can sharply be shorted, and a heavy metal contamination can be decreased.

Figure 10:
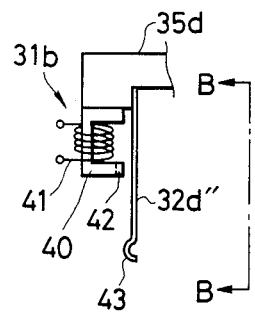
FIG. 10 is a front view of another embodiment of a sample chucking apparatus constructed in accordance with the present invention.
Figure 11:
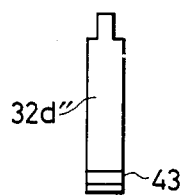
FIG. 11 is a view taken along the line B—B of a clip of FIG. 10.

The embodiment of FIGS. 10 and 11 varies from FIG. 8 in that only an area of the portion corresponding to the yoke 40 of the solenoid 31b is enlarged in a clip 31d''.

In the embodiment of FIGS. 10 and 11, since only an area of the portion corresponding to the yoke of the solenoid 31b is larger, a low value is secured as a spring constant of the clip 32d'', and a large electrostatic adsorption power is attained, therefore, a high reliability is obtainable.

While, in the above described embodiments, where the sample wafer has been described as being carried and fixed with the surface to be processed in a vertical position, the sample chucking apparatus according to this invention is not limited to a position of the surface to be processed and, consequently, is freely employed for carrying and fixing the sample at every position under vacuum. Further in the above described embodiments, the clip is actuated to open on a magnetic force and also to close on a spring force; however, the clip can be actuated to close on a magnetic force and also to open on a spring force.

As described above, the sample chucking apparatus of this invention comprises a clip provided at plural positions correspondingly to a sample and operated closedly to release and hold the sample, a means for actuating the clip on a magnetic force, and a means for actuating the clip on a spring force counter to the direction in which the clip operates, thereby simplifying the structure and ensuring a reliability on fixing or carrying of the sample.

What is claimed is:

1. A sample chucking apparatus, comprising a base adapted to be moved in a vacuum chamber and to face a sample, clip means provided at a plurality of positions for supporting and releasably holding said sample, said clip means being movable with said base in accordance with a movement of said base, means mounted on said base for magnetically actuating said clip means to selectively open and close said clip means, and means for applying a spring force to said clip means in a direction opposite to a direction of a magnetic force applied on said clip means by said means for magnetically actuating said clip means.

2. A sample chucking apparatus comprising clip means provided at a plurality of positions for receiving a sample and operable to releasably hold the sample, said clip means comprises an elastic clip formed of a magnetic material, means for magnetically actuating the clip means, said means for magnetically actuating the clip means comprises a solenoid means, said solenoid means includes a yoke, a coil wound on the yoke, and a stopper means provided on said yoke cooperable with said clip means, said stopper means is formed of a nonmagnetic material, and means for applying a spring force on the means in a direction counter to a direction in which said clip means is actuated by said means for magnetically actuating, said means for applying the spring force includes the clip means.

3. The sample chucking apparatus as defined in claim 2, wherein said yoke, said coil, and said clip means are coated with a material for enabling a reduced emission gas as compared with a magnetic material under a vacuum.

4. The sample chucking apparatus as defined in claim 2, wherein only an area of a portion of said yoke is enlarged in said clip means.

5. A sample chucking apparatus, comprising a rotatable shaft, a shaft reciprocatably provided on said rotatable shaft, a base provided on the reciprocatable shaft, clips provided at a plurality of positions on said base corresponding to a sample and operable to releasably hold said sample, means provided on said base for magnetically actuating said clips, and means for actuating the clips in a direction counter to a direction in which said clips are actuated by a magnetic force of said means for magnetically actuating said clips.

6. A sample chucking apparatus, comprising a base adapted to be moved in a vacuum chamber and face a sample, clip means provided at a plurality of positions for supporting and releasably holding said sample, said clip means being movable with said base in accordance with a movement of said base, means mounted on said base for electromagnetically actuating said clip means to selectively open and close said clip means, and means for applying a spring force to said clip means in a direction opposite to a direction of a electromagnetic force applied on said clip means by said means for electromagnetically actuating said clip means.

7. A sample chucking apparatus comprising a base adapted to be moved in a vacuum chambe and to face a sample, clip means provided at a plurality of positions for supporting and releasably holding said sample, said clip means being movable with said base in accordance with a movement of said base, means mounted on said base for electromagnetically actuating said clip means to selectively open and close said clip means, means for applying a spring force on said clip means to counteract an electromagnetic force applied to said clip means by said means for electromagnetically actuating said clip means, and means for expanding an amount of opening or closing of said clip means.

8. The sample chucking apparatus according to claim 7, wherein said means for electromagnetically actuating said clip means includes a solenoid for drawing and moving the plunger under excitation of the solenoid, said means for applying a spring force to said clip means includes a coil spring, and said means for expanding the amount of opening or closing of said clip means includes a rotatable arm having a pivot point at a central portion thereof, said solenoid is mounted to said base so that a moving direction of said plunger is approximately normal to a surface of the sample, said plunger is provided at one end of said arm, said clip means is mounted to the other end of said arm, and wherein said coil spring is disposed between said base and said other end of said arm.

9. The sample chucking apparatus as defined in claim 7, wherein said means for electromagnetically actuating said clip means includes a solenoid for drawing and moving a plunger upon excitation of the solenoid, said means for applying a spring force to said clip means includes a coil spring, and said means for expanding the amount of opening or closing of said clip means includes a rotatable arm having a pivot point substantially centrally thereof, said solenoid is mounted to said base so that a moving direction of said plunger is approximately in parallel to a surface of the sample, said plunger being provided at one end of said arm, said clip means being mounted to the other end of said arm, and said coil spring is disposed between said base and said plunger.

10. A sample chucking apparatus comprising a rotatable shaft mounted approximately vertically in a vacuum chamber, a shaft mounted to said rotatable shaft for reciprocable movement approximately in a horizontal direction, a base disposed so as to face a sample, clip means provided at a plurality of positions for supporting and releasably holding said sample, said clip means being movable with said base in accordance with a movement of said base, means mounted to said base for electromagnetically actuating said clip means to open and close said clip means, and means for applying a spring force to said clip means for actuating the same to open or close said clip means, said means for applying a spring force acting on said clip means in a direction opposite to an electromagnetic force of said means for electromagnetically actuating said clip means.

* * * * *